United States Patent [19]
Turlapaty et al.

[11] Patent Number: 6,097,200
[45] Date of Patent: Aug. 1, 2000

[54] MODULAR, SEMICONDUCTOR RELIABILITY TEST SYSTEM

[75] Inventors: Venu Turlapaty, Vadnais Heights; Brent Harry, White Bear Lake; Timothy McMullen, Lino Lakes; Richard Benjamin, White Bear Lake, all of Minn.

[73] Assignee: Aetrium Incorporated, North St. Paul, Minn.

[21] Appl. No.: 08/725,935

[22] Filed: Oct. 7, 1996

[51] Int. Cl.[7] .................................................. G01R 31/22
[52] U.S. Cl. ........................................... 324/760; 324/765
[58] Field of Search .................................... 324/765, 760, 324/73.1, 158.1; 165/80.4, 104.33; 361/698, 699; 219/209, 385

[56] References Cited

U.S. PATENT DOCUMENTS

| | | |
|---|---|---|
| 3,656,058 | 4/1972 | Leathers . |
| 4,374,317 | 2/1983 | Bradshaw ................................ 219/385 |
| 4,777,434 | 10/1988 | Miller et al. . |
| 5,003,156 | 3/1991 | Kilpatrick et al. ....................... 219/209 |
| 5,103,168 | 4/1992 | Fuoco ...................................... 324/73.1 |
| 5,126,656 | 6/1992 | Jones ...................................... 324/760 |
| 5,329,093 | 7/1994 | Okano . |
| 5,385,487 | 1/1995 | Beitman . |
| 5,515,910 | 5/1996 | Hamilton et al. ........................ 324/760 |

FOREIGN PATENT DOCUMENTS

| | | |
|---|---|---|
| 0413542 | 2/1991 | European Pat. Off. . |
| 0699912 | 3/1996 | European Pat. Off. . |

*Primary Examiner*—Vinh P. Nguyen
*Attorney, Agent, or Firm*—Alan Kamrath; Oppenheimer Wolff & Donnelly LLP

[57] ABSTRACT

A system (10) for performing semiconductor reliability tests is disclosed including an oven (36) having open axial ends for slideably receiving a board (12). The board (12) includes an oven region (16) which is removably received in the oven (36) and which is located intermediate connection and exterior regions (14, 18) located axially outside of the oven (36). A temperature sensor (30) is positioned in the oven region (16) and its calibration device (32) is located in the exterior region (18). Contacts (34) on the axial free edge of the connection region (14) are slideably received in an electrical connector (72). The board (12) is formed of low heat transfer material so that the connection and exterior regions (14, 18) and the electrical connector (72) is not heated by the oven (36) and includes a handle (22) on the axial free edge of the exterior region (18). The heat transfer element (38) of the oven (36) has a large thermal mass and is in close and uniform proximity to the DUTs (28) received on the board (12).

20 Claims, 2 Drawing Sheets

MODULAR, SEMICONDUCTOR RELIABILITY TEST SYSTEM

BACKGROUND

The present invention generally relates to systems for testing of electronic devices, relates particularly to semiconductor reliability test systems for testing of electronic devices, and relates specifically to semiconductor reliability test systems for simultaneously testing of a plurality of electronic devices on a board.

In conventional burn-in ovens, multiple electronic devices were simultaneously tested together on multiple boards in a single cavity. As the DUTs and boards were different distances from the heat source, air was moved by fans inside of the cavity to evenly distribute the heat, with heat transfer to the DUTs being largely by convection. This resulted in several problems. First, moving air caused high pressure zones in the cavity which tended to force heated air out of the cavity and caused low pressure zones in the cavity which tended to draw outside ambient air in the cavity to replace the heated air which escaped. This results in uneven heat transfer rates and reduced operational efficiencies. Further, over time, the operation of the fan changed due to breakage and wear. Thus, even though designed and adjusted for optimal operation when leaving the factory, optimal operation was not continuously and indefinitely maintained over the life of the conventional oven in the field. Additionally, due to the continual influx of air, humidity of outside ambient air caused operational difficulties. When humidity posed a problem, conventional ovens were filled with dry nitrogen gas to replace the air in the interior and thus increasing operational costs.

Also, as multiple boards were in the same cavity, if it was desired to replace or modify one of the boards in the cavity, the door was opened to the cavity allowing heated air to escape and ambient air to enter the cavity. This exchange of air clearly had an effect on the conditions inside of the cavity and specifically of the remaining boards still under test. This effect was minimized if the door was opened and closed quickly but clearly never reduced to zero. Also, such exchange of air results in higher operational costs.

Further, typically the entire board was placed in the cavity with the other boards and electrical connections to the boards were made inside of the cavity. It can then be appreciated that in addition to the DUTs, the electrical connections to the boards were also heated every time that a test was performed. Heating of the electrical connections to the boards placed the electrical connections under thermal stress and resulted in reduced life and was a major cause of failure of the boards. This also results in higher operational costs. In addition, if it was necessary to remove one of the boards from the cavity, it was often necessary to reach inside of the cavity with high temperature tongs and attempt to grasp the board located inside of the cavity.

Further conventional ovens included a temperature sensor inside of the cavity and a temperature calibration device located outside the cavity. The temperature sensor and calibration device were calibrated together. The temperature sensor was generally located near the center of a cavity rather than adjacent the DUTs and measured the temperature of a large amount of moving air within the cavity rather than just the air adjacent to the DUTS. Thus, inaccuracies arose in temperature measurement which could affect the testing results. Also, due to the inaccuracies of temperature measurement, two ovens having identical temperature test settings did not necessarily have identical actual temperatures so that it was difficult to test the same DUTs in different ovens under identical conditions to compare test results. Also, in the event that the temperature sensor and/or calibration device should fail or otherwise lose their calibration, it was not possible to replace any failed component or to recalibrate in the field, but it was necessary to return the oven to the factory or like facility for recalibration.

Thus, a need exists for a system for simultaneously testing a plurality of electronic devices on boards which overcomes the disadvantages and deficiencies of prior burn-in and semiconductor reliability test systems.

SUMMARY

The present invention solves this need and other problems in the field of semiconductor reliability test systems and methods by providing, in the most preferred form, an oven having a cavity for removably receiving a board having DUTs removably received in provisions on the board, with the oven including a heat transfer element having a large thermal mass and having an area corresponding to the area of the provisions when the board is received in the cavity, with the heat transfer element having a uniform spacing from the provisions when the board is received in the cavity and being in close proximity to the extent of the DUTs received on the board.

In another aspect of the present invention, the board is formed of material having low heat transfer rates and includes an oven region and an exterior region. Only the oven region includes the provisions for receiving the DUTs and is received in the cavity of the oven with the exterior region located outside of the oven so that it is not heated by the oven. In preferred embodiments, the temperature sensor for the system is located on the board in the oven region and the temperature calibration device is located on the board in the exterior region.

In still other aspects of the present invention, the board is formed of material having low heat transfer rates and includes an oven region and a connection region including contacts for electrical connection to an electrical connector. Only the oven region includes the provisions for receiving the DUTs and is received in the cavity of the oven when electrical connection is made between the contacts and the electrical connector which are located outside of and not heated by the oven.

In most preferred aspects of the present invention, the board includes the oven region intermediate the exterior and connection regions, with the board being slid into the oven cavity, with the connection region sliding into and through the oven cavity when the oven region is received in the oven cavity.

It is thus an object of the present invention to provide novel semiconductor reliability test systems and methods.

It is further an object of the present invention to provide such novel semiconductor reliability test systems and methods which do not utilize moving air to evenly distribute heat.

It is further an object of the present invention to provide such novel semiconductor reliability test systems and methods where all DUTs have uniform spacing from the heat source.

It is further an object of the present invention to provide such novel semiconductor reliability test systems and methods where all DUTs are in close proximity to the heat source.

It is further an object of the present invention to provide such novel semiconductor reliability test systems and methods where each board is located in its own cavity.

It is further an object of the present invention to provide such novel semiconductor reliability test systems and methods where the removable electrical connections to the board are not heated.

It is further an object of the present invention to provide such novel semiconductor reliability test systems and methods where the board has a cool exterior allowing ease of removal from and handling outside the oven cavity.

It is further an object of the present invention to provide such novel semiconductor reliability test systems and methods where the temperature sensor is located in close proximity to the DUTs.

It is further an object of the present invention to provide such novel semiconductor reliability test systems and methods where the temperature sensor and calibration device are physically connected to the same component and are removable from the oven.

It is further an object of the present invention to provide such novel semiconductor reliability test systems and methods where the temperature sensor and calibration device are positioned on the board for the DUTs.

These and further objects and advantages of the present invention will become clearer in light of the following detailed description of an illustrative embodiment of this invention described in connection with the drawings.

DESCRIPTION OF THE DRAWINGS

The illustrative embodiment may best be described by reference to the accompanying drawings where.

Figure 1:
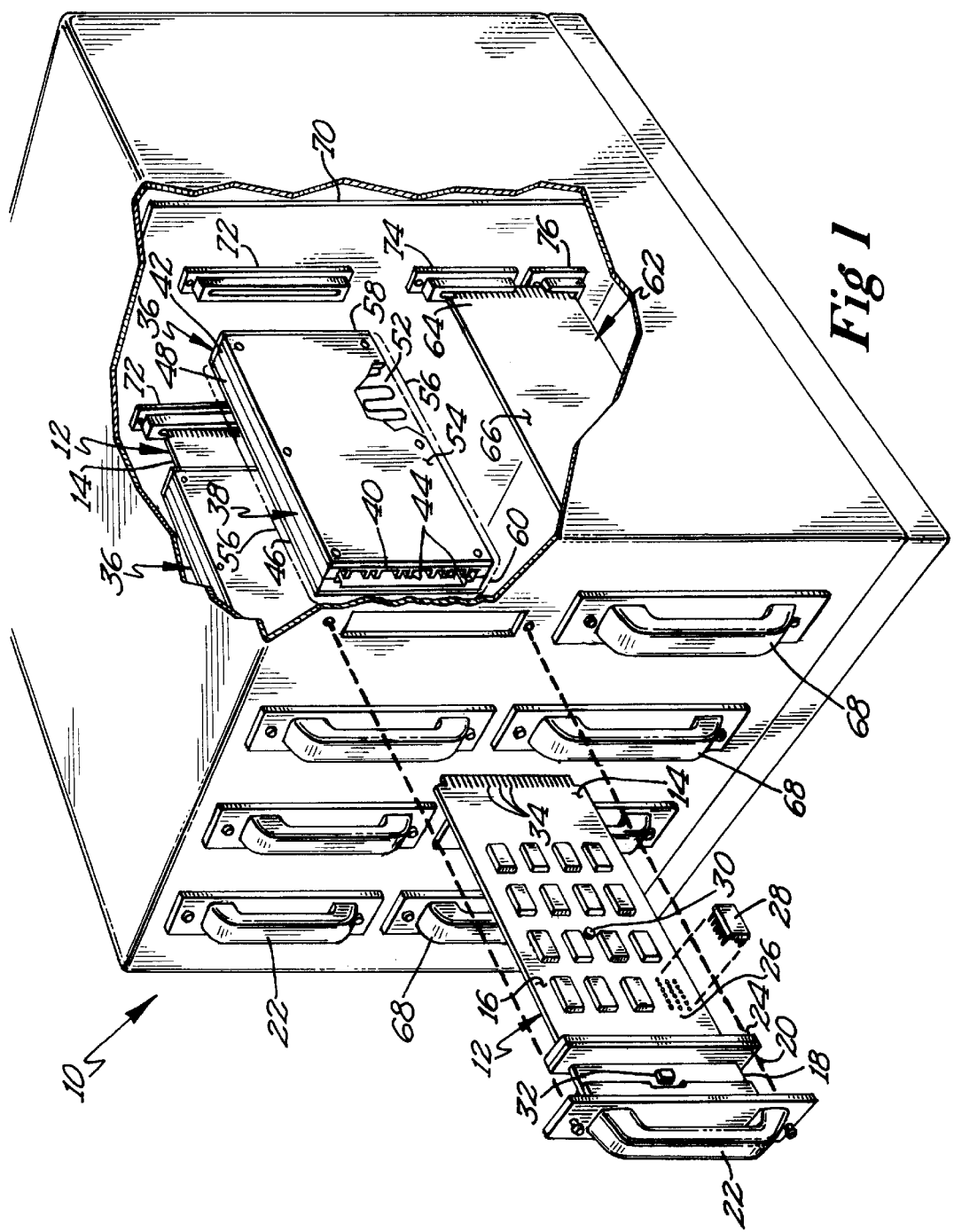
FIG. 1 shows a diagrammatic, exploded, perspective view of a modular, semiconductor reliability test system according to the preferred teachings of the present invention, with portions broken away and shown in phantom to show constructional details.
Figure 3:
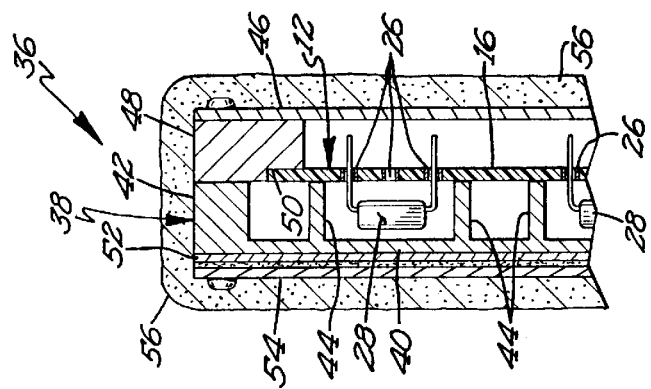
FIG. 3 shows a partial, enlarged cross-sectional view of the oven of the semiconductor reliability test system of FIG. 1.
Figure 2:
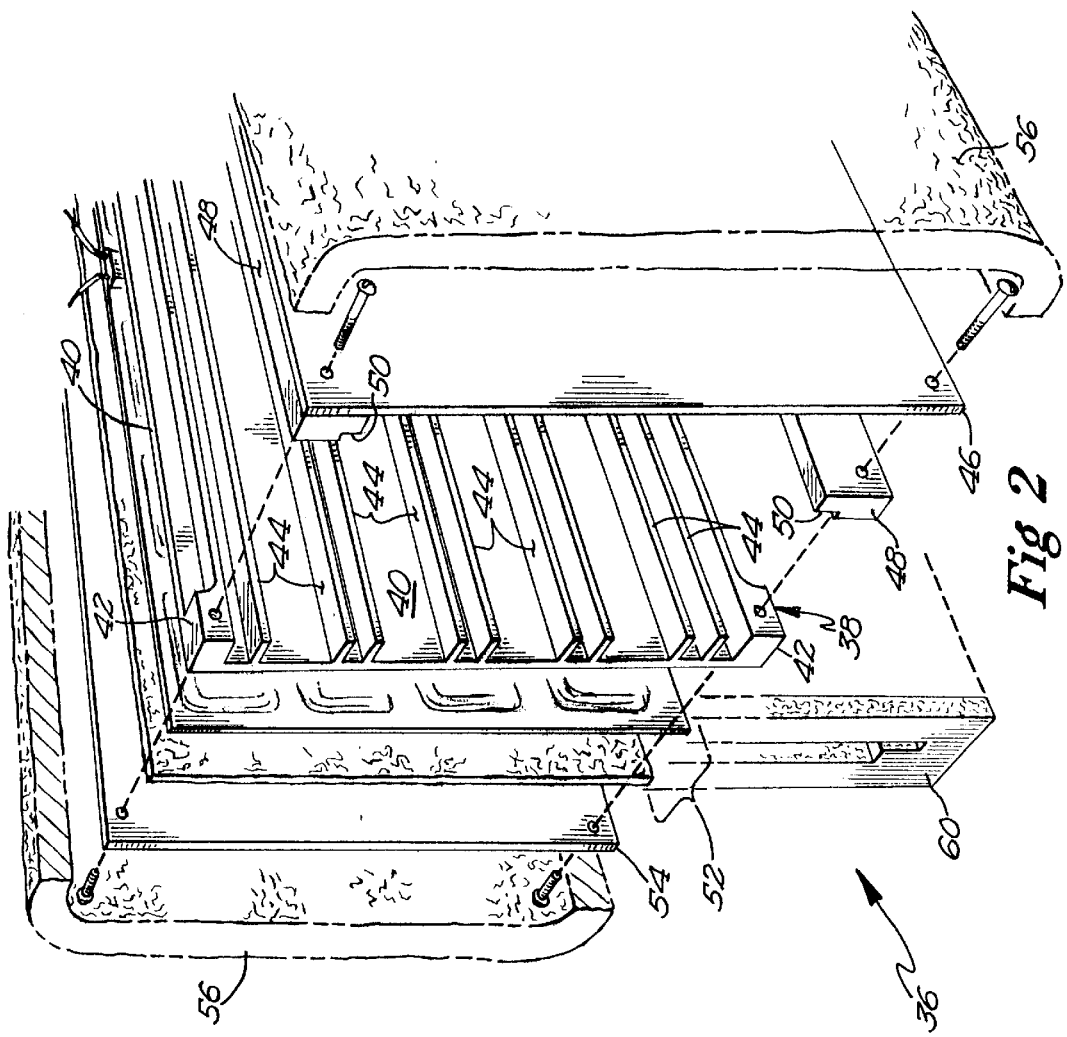
FIG. 2 shows a partial, exploded perspective view of the oven of the semiconductor reliability test system of FIG. 1, with portions shown in phantom to show constructional details.

All figures are drawn for ease of explanation of the basic teachings of the present invention only; the extensions of the Figures with respect to number, position, relationship, and dimensions of the parts to form the preferred embodiment will be explained or will be within the skill of the art after the following description has been read and understood. Further, the exact dimensions and dimensional proportions to conform to specific force, weight, strength, and similar requirements will likewise be within the skill of the art after the following description has been read and understood.

Where used in the various figures of the drawings, the same numerals designate the same or similar parts. Furthermore, when the terms "top", "bottom", "first", "second", "front", "upper", "lower", "width", "length", "end", "side", and similar terms are used herein, it should be understood that these terms have reference only to the structure shown in the drawings as it would appear to a person viewing the drawings and are utilized only to facilitate describing the illustrative embodiment.

DESCRIPTION

A modular, semiconductor reliability test system according to the preferred teachings of the present invention is shown in the drawings and generally designated 10. In the most preferred form, multiple systems 10 are constructed together in a single module for marketing purposes, with four systems 10 being constructed together in a single module in the most preferred form as shown in FIG. 1. In the most preferred form, the modules are designed to be stacked adjacent and/or on top of each other.

Each system 10 includes a DUT board 12 of a generally rectangular, planar configuration. Board 12 includes a cool connection region 14, an oven region 16, and a cool exterior region 18, with the oven region 16 located intermediate connection region 14 and exterior region 18. A collar 20 is suitably secured to board 12 by any suitable means at the interconnection between regions 16 and 18. A handle 22 is suitably secured to the free end of region 18. An annular heat seal 24 is slideably received on board 12 for abutment with collar 20 on the side opposite handle 22.

An array of multiple provisions 26 for removably receiving a plurality of electronic devices under test (DUT) 28 is located within an area on the first face of board 12 and specifically exclusively within region 16. In the preferred form, the array of provisions 26 includes four rows and four columns so that region 16 can accept up to sixteen DUTs 28. DUTs 28 received in provisions 26 extend beyond a first face of board 12 to the same extent. In the most preferred form, DUTs 28 are removably received only on the first face of board 12 and specifically not on the second face of board 12 opposite to the first face.

Region 16 further includes a temperature sensor 30 positioned generally centrally of the array of provisions 26, with sensor 30 being in the form of a resistive temperature device (RTD) in the preferred form. A temperature calibration device 32 is secured to board 12 in region 18 and in particular between collar 20 and handle 22, with device 32 being in the form of an electrically erasable programmable read only memory (EEPROM) in the preferred form. It should be appreciated that sensor 30 and device 32 are physically connected to the same component, namely board 12 in the preferred form. The free edge of region 14 includes a plurality of connection contacts 34. Suitable electrical connection is made from each of the pin locations of provisions 26, from sensor 30, and from device 32 to a corresponding contact 34 in region 14.

Each system 10 further includes an oven 36 for slideably receiving a single board 12. Oven 36 is of a generally rectangular configuration of an axial length less than the length of board 12 and generally equal to the length of region 16. Oven 36 generally includes a heat transfer element 38 formed of highly heat conductive material such as aluminum and having a relatively large thermal mass. Element 38 in the preferred form generally includes a flat plate 40 having parallel first and second sides 42 extending perpendicularly from the opposite side edges thereof. First and second planar ribs 44 integrally extend from plate 40 parallel to each other at locations corresponding to and opposite to each of the rows of provisions 26 of board 12, with four pairs of ribs 44 being provided in the preferred form. Ribs 44 and sides 42 have the same and uniform extent from plate 40.

Oven 36 further includes a planar closure plate 46 extending parallel to plate 40 and sandwiching first and second spacers 48 against the free edges of sides 42. Spacers 48 have dimensions parallel to plate 40 greater than the dimension of sides 42 parallel to plate 40. Spacers 48 each include a groove 50 formed in the face abutting with side 42 and extending from the inside edge thereof. Groove 50 has a depth generally equal to the thickness of board 12. It can be appreciated that an oven cavity having first and second open axial ends is formed and defined by heat transfer element 38, spacers 48, and plate 46. Board 12 is removably received and in the most preferred form is slideably received in the cavity of oven 36 having its second face (adjacent to plate 46) adjacent to its upper and lower edges in close proximity with spacers 48 in grooves 50 and having its first face (adjacent to element 38) in close proximity with the free edges of ribs 44 intermediate the rows of provisions 26. Specifically, the free edges of ribs 44 and the faces of spacers 48 inside grooves 50 are adjacent or abut with the faces of board 12.

Suitable provisions such as an electric heater 52 are provided to transfer heat to heat transfer plate 38. In the most preferred form, heater 52 is sandwiched against the outer face of plate 40 by a plate 54. Suitable insulation 56 is provided around plates 46 and 54, sides 42, and spacers 48. Suitable insulation 58 is further provided to cover the inner axial end of oven 36 and includes a slot having a height and width corresponding to and for relatively closely slideably receiving board 12 and in particular region 14. Suitable insulation 60 is also provided to cover the outer axial end of oven 36 and includes a slot for slideably receiving board 12 as well as DUTs 28 secured thereto and in particular regions 14 and 16. Insulation 56, 58, and 60 should be sufficient to retain heat inside of oven 36. It is most desirable that the particular insulation 56, 58, and 60 utilized have a minimal thickness to reduce the overall size and footprint of system 10.

Each system 10 further includes an application driver board 62 which includes a connection region 64 and a hardware region 66. A handle 68 having the same aesthetic appearance as handle 22 is connected to the end of board 62 opposite to region 64. Suitable hardware is provided in region 66 for performing a desired reliability test on DUTs 28 located on board 12 in oven 36 including stressing DUTs 28 and doing all of the test measurements. Further, such hardware would include an oven controller which communicates with sensor 30 and device 32. Boards 62 are slideably received in system 10 and it can be appreciated that multiple boards 62 can be provided having hardware for different reliability tests. In the most preferred form, multiple application driver boards 62 are provided each including hardware for performing one type of reliability test and specifically not for performing all types of reliability tests so that the hardware can be optimized for each of the reliability tests. Thus, system 10 with board 62 having one type of hardware can be utilized to perform one type of reliability test and then can be utilized to perform another type of reliability test by simply replacing board 62 with another board 62 having hardware necessary to perform that reliability test.

Each system 10 further includes a backplane 70. Backplane 70 includes a first set of female connectors 72 for each system 10 for removable electrical connection to contacts 34 of board 12. Connector 72 is located in the slide direction of board 12 from the axial end of oven 36 covered by insulation 58. Backplane 70 further includes a second set of female connectors 74 for each system 10 for removable electrical connection to contacts of board 62. Connectors 72 and 74 are suitably electrically connected together to thereby electrically connect DUTs 28, sensor 20, and device 32 on board 12 to the hardware on board 62. Backplane 70 further includes a third set of female connectors 76 for each system 10 for removable electrical connection to contacts of board 62. Connectors 76 are suitably electrically connected to a user interface PC controller such as a Windows NT-based Pentium in the preferred form and a test control unit such as an embedded DOS-based Pentium, not shown, to thereby electrically connect the hardware on board 62 to the user interface PC and the test control unit. The test control unit's function is to supervise the tests and store the data.

It should be appreciated that heat transfer element 38 is controlled by sensor 30 and temperature calibration device 32. Specifically, sensor 30 monitors the temperature inside of oven 36 closely adjacent DUTs 28 so that the hardware on board 62 takes the temperature reading of sensor 30 and correlates the calibration data in temperature calibration device 32 to accurately adjust the temperature inside of oven 36 to within 1° C. of the temperature setting.

Now that the basic construction of system 10 according to the preferred teachings of the present invention has been set forth, the operation of system 10 can be explained and some of the advantages obtained can be highlighted. For the sake of explanation, it will be assumed that board 62 including the hardware for performing the desired reliability test is in system 10 and in electrical connection with connectors 74 and 76. Further, it will be assumed that board 12 is removed from system 10 and DUTs 28 desired to be subjected to the is reliability test are secured to provisions 26. It should be appreciated that the number of DUTs 28 on board 12 can be in the range of 1 to the total number of provisions 26 on board 12 which is 16 in the preferred form. At that time, the free edge of region 14 of board 12 can be aligned with the slot in insulation 60 of oven 36. Once so aligned, board 12 can be slid in a slide direction parallel to the rows of the array of provisions 26 and ribs 44 of heat transfer element 38 into oven 36 such that the free edge of region 14 passes through the slot in insulation 60, between the face of grooves 50 of spacers 48 and the free edges of ribs 44, through the slot in insulation 58, and into connector 72. With the free edge of region 14 in connector 72, electrical connection is made between contacts 34 and connector 72 and board 12 is in its test position. It should be noted that the receipt of the free edge of region 14 in connector 72 and the sandwiching of heat seal 24 against insulation 60 prevents board 12 from further sliding into oven 36 and specifically prevents region 18 from sliding into the cavity of oven 36. When board 12 is received in the cavity of oven 36, ribs 44 extend parallel to and intermediate the rows of the array of provisions 26 and are in close proximity to the pin edges of DUTs 28 received on board 12.

With board 12 in its test position, seal 24 should be tightly sandwiched between collar 20 and insulation 60. It should be appreciated that suitable provisions such as screws carried by handle 22 and threaded into the frame of system 10 can be provided for drawing and holding board 12 into the testing position. Additionally, in the testing position, insulation 58 should be in close contact with board 12. Thus, region 16 should be in a tightly insulated interior cavity of oven 36.

While board 12 is in the test position, the interior cavity of oven 36 can be heated to the desired temperature and DUTs 28 are held for the desired length of time to perform the desired reliability test under the control of the hardware on board 62. It should be appreciated that board 12 is formed of material having a very low heat transfer rate. Thus, although region 16 is located within oven 36 and subjected to very high temperatures, regions 14 and 18 are located exterior to oven 36 at ambient temperatures and are not subjected to heat from oven 36 due to insulation 56, 58, and 60. Additionally, due to the low heat transfer rate of board 12, heating of region 16 of board 12 does not result in a significant increase in temperature in regions 14 and 18 of board 12. This results in many advantages. First, contacts 34 and connectors 72 are located at ambient temperatures and specifically are not located inside oven 36 and subjected to heat. Heating of the electrical connections with prior boards 12 was a major cause of failure of prior boards 12. Additionally, accuracy of the measurements are improved since the electrical connections are not under thermal stress.

Second, as region 18 is located outside of and not heated by oven 36 and is not subject to significant increase in temperature, board 12 can be provided with handle 22 which remains cool. Thus, handle 22 can be grasped and board 12 easily and safely removed while oven.

Also, as region 18 is not subject to significant increase in temperature, device 32 which is not desired to be subjected to high temperatures can be positioned on board 12 with sensor 30 rather than as part of oven 36. As calibration of sensor 30 and device 32 generally can not be performed in the field, it is not necessary to return oven 36 to the factory or the like in the event that one or the other of sensor 30 and device 32 should fail or otherwise lose their calibration. Additionally, as board 12 will require periodic replacement, sensor 30 and device 32 will also be replaced whenever board 12 is replaced and will not be prone to failure because of age. It should be realized that each pair of sensor 30 and device 32 is different than other pairs so that oven 36 will have slight variations of temperature even though the pairs of sensor 30 and 32 of different boards 12 are calibrated to be the same. Where slight variations in temperature are significant such as in laboratory testing, the same board 12 can be utilized at different times and/or with different ovens 36 and as such board 12 would have the same sensor 30 and device 32, the temperature of oven 36 would be identical in every test. It should be appreciated that it would be impractical to move prior ovens to different physical locations so that testing of DUTs 28 with the same pair of sensor 30 and device 32 could be undertaken.

It should be noted that due to the connection of boards 12 and 62 to the same backplane 70, the distance from DUTs 28 on board 12 to the hardware on board 62 is extremely short, which further improves the accuracy of the tests.

Oven 36 according to the preferred teachings of the present invention removably and slideably receives and is utilized to heat only a single board 12 as opposed to multiple boards as in conventional ovens. In the preferred form where multiple systems 10 are constructed together in a module, several boards 12 corresponding to the number of systems 10 can be tested simultaneously, with boards 12 being subjected to the same or different tests. It can then be appreciated that one board 12 can be removed from its corresponding oven 36 and changed and/or replaced without in any way affecting the remaining boards 12 and their corresponding ovens 36. Likewise, only the ovens 36 corresponding to the number of boards 12 desired to be tested need to be operated while the remaining ovens 36 constructed together in a module need not be operated. Thus, system 10 according to the teachings of the present invention provides a tremendous amount of flexibility and redundancy.

Additionally, since only a single board 12 is being heated in each oven 36, the distance between DUTs 28 and the source of heat which in the preferred form is heat transfer element 38 having an area corresponding to the area of provisions 26 in region 16 is uniform for all DUTs 28 on board 12. Due to the high heat conductivity and relatively large thermal mass of heat transfer element 38, the heat transfer rate is uniform for all DUTs 28 independent of their positioning on board 12. Additionally, heat transfer element 38 is in close proximity to DUTs 28 and in the preferred form approximately one-tenth of an inch (2.5 mm) on three sides of DUTs 28 so that in the most preferred form DUTs 28 are generally radiantly heated. In this regard, the close proximity of plate 40 to the top face of DUTs 28 insures heat transfer thereto and the close proximity of ribs 44 to the pin edges of DUTs 28 maintains heat in channels in oven 36 and reduces thermal flows inside of oven 36. It should be appreciated that system 10 according to the teachings of the present invention has special application for use with DUTs 28 including special test packages having industry standard sizes as heat transfer element 38 and specifically ribs 48 can be of a standard design according to the industry standard sizes.

It should then be appreciated that oven 36 according to the preferred teachings of the present invention does not rely on moving air to evenly distribute heat to DUTs 28. Thus, no fan or similar moving parts are required to create movement of air. Also, as the air is generally static inside the cavity of oven 36, no high or low pressure zones are created in the cavity of oven 36 so that leakage of air into or out of oven 36 is not predisposed. In fact, due to the close and uniform proximity of heat transfer element 38 to DUTs 28 and board 12, only a relatively small amount of air is present inside of the cavity of oven 36 having minimal effect on heat transfer. In fact, it is believed it may be advantageous to remove the air from the cavity of oven 36 with heat transfer then occurring solely by radiation and conduction. Thus, oven 36 according to the preferred teachings of the present invention is of a relatively simple design as no fans, electronics, or moving parts are required in its fabrication. A clear cost advantage is then obtained by oven 36 of the present invention over conventional multi-board cavity type ovens. Therefore, system 10 utilizing oven 36 according to the teachings of the present invention is cost competitive with such conventional burn-in ovens even though system 10 provides greater flexibility, redundancy, and reduced operational costs.

Now that the basic teachings of the present invention have been explained, many extensions and variations will be obvious to one having ordinary skill in the art. For example, although system 10 in the most preferred form includes several unique features and is believed to produce synergistic results, a semiconductor reliability test system 10 could be constructed according to the teachings of the present invention utilizing such features individually or in other combinations. As an example, board 12 including a cool connection region 14 which is located outside of the cavity of oven 36 according to the teachings of the present invention or according to conventional practice could be constructed according to the teachings of the present invention.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. Semiconductor reliability test system for testing a plurality of DUTs comprising, in combination: a board of a generally planar configuration, with the board having a first face, with the board having a plurality of provisions for removably receiving DUTs, with the DUTs extending beyond the face to an extent, with the provisions located within an area on the face of the board; and an oven having a cavity for removably receiving the board having DUTs received thereon, with the oven including a heat transfer element having a large thermal mass and having an area corresponding to the area of the provisions when the board is received in the cavity, with the heat transfer element having a uniform spacing from the provisions when the board is received in the cavity and being in close and uniform proximity to the extent of the DUTs received on the board.

2. The semiconductor reliability test system of claim 1 wherein the provisions are arranged in an array having rows and columns, with the heat transfer element including ribs extending parallel to and intermediate the rows of the provisions when the board is received in the cavity and being in close and uniform proximity to the DUTs received on the board when the board is received in the cavity, with the ribs having free edges adjacent the face of the board.

3. The semiconductor reliability test system of claim 2 wherein the cavity slideably receives the board in a slide direction parallel to the rows of the provisions.

4. The semiconductor reliability test system of claim 3 wherein the cavity slideably receives only a single board.

5. The semiconductor reliability test system of claim 4 wherein the board has a second face opposite to the first face, with the DUTs being removably received only on the first face.

6. The semiconductor reliability test system of claim 3 wherein the oven includes a first axial end including a slot for slideably receiving the board having DUTs received thereon; wherein the board includes an oven region and an exterior region, with the provisions located exclusively in the oven region, with only the oven region being received in the cavity and the exterior region of the board being prevented from sliding into the cavity, with the board being formed of material having low heat transfer rates so that the exterior region is not heated by the oven.

7. The semiconductor reliability test system claim 6 further comprising, in combination: a temperature sensor located on the board in the oven region; and a temperature calibration device for the sensor and located on the board in the exterior region, with the heat transfer element being controlled by the sensor and the temperature calibration device.

8. The semiconductor reliability test system of claim 7 wherein the oven includes a second axial end including a slot for slideably receiving the board; wherein the board further includes a connection region, with the oven region located intermediate the exterior region and the connection region; and wherein the burn-in system further comprises, in combination: contacts formed on the connection region in electrical connection with the temperature sensor and the temperature calibration device and the DUTs received on the board; and an electrical connector located exterior to the oven and in the slide direction from the second axial end for slideably receiving the connection region of the board when the oven region is received in the cavity and for removable electrical connection to the contacts, with the connection region and the electrical connector not being heated by the oven when the oven region is received in the cavity.

9. The semiconductor reliability test system of claim 7 further comprising, in combination: a collar secured to the board between the oven region and the exterior region, with the collar abutting with the oven preventing the exterior region from sliding into the cavity of the oven.

10. The semiconductor reliability test system of claim 6 further comprising, in combination: a collar secured to the board between the oven region and the exterior region, with the collar abutting with the oven preventing the exterior region from sliding into the cavity of the oven.

11. The semiconductor reliability test system of claim 1 wherein the cavity slideably receives only a single board.

12. Semiconductor reliability test system for testing a plurality of DUTs comprising, in combination: a board of a generally planar configuration and including an oven region and an exterior region, with the oven region having a plurality of provisions for removably receiving DUTs, with the provisions located exclusively in the oven region; and an oven having a cavity for removably receiving the oven region of the board having DUTs received thereon while the exterior region of the board is located outside of the cavity, with the board being formed of material having low heat transfer rates so that the exterior region is not heated by the oven; wherein the cavity slideably receives the board in a slide direction; wherein the oven includes a first axial end including a slot for slideably receiving the board having DUTs received thereon; and wherein the exterior region of the board is prevented from sliding into the cavity.

13. The semiconductor reliability test system of claim 12 further comprising, in combination: a temperature sensor located on the board in the oven region; and a temperature calibration device for the sensor and located on the board in the exterior region, with the oven being controlled by the sensor and the temperature calibration device.

14. The semiconductor reliability test system of claim 13 wherein the oven includes a second axial end including a slot for slideably receiving the board; wherein the board further includes a connection region, with the oven region located intermediate the exterior region and the connection region; and wherein the semiconductor reliability test system further comprises, in combination: contacts formed on the connection region in electrical connection with the temperature sensor and the temperature calibration device and the DUTs received on the board; and an electrical connector located exterior to the oven and in the slide direction from the second axial end for slideably receiving the connection region of the board when the oven region is received in the cavity and for removable electrical connection to the contacts, with the connection region and the electrical connector not being heated by the oven when the oven region is received in the cavity.

15. The semiconductor reliability test system of claim 14 further comprising, in combination: a collar secured to the board between the oven region and the exterior region, with the collar abutting with the oven preventing the exterior region from sliding into the cavity of the oven.

16. The semiconductor reliability test system of claim 13 further comprising, in combination: a collar secured to the board between the oven region and the exterior region, with the collar abutting with the oven preventing the exterior region from sliding into the cavity of the oven.

17. The semiconductor reliability test system of claim 12 further comprising, in combination: a collar secured to the board between the oven region and the exterior region, with the collar abutting with the oven preventing the exterior region from sliding into the cavity of the oven.

18. The semiconductor reliability test system of claim 12 wherein the provisions are arranged in an array having rows and columns, with the oven having a heat transfer element including ribs extending parallel to and intermediate the rows of the provisions when the board is received in the cavity.

19. The semiconductor reliability test system of claim 12 wherein the cavity slideably receives only a single board.

20. The semiconductor reliability test system of claim 12 wherein the board has a first face and a second face opposite to the first face, with the DUTs being removably received only on the first face.

* * * * *

UNITED STATES PATENT AND TRADEMARK OFFICE
CERTIFICATE OF CORRECTION

PATENT NO. : 6,097,200
DATED : August 1, 2000
INVENTOR(S) : Venu Turlapaty, et al.

It is certified that error appears in the above-identified patent and that said Letters Patent is hereby corrected as shown below:

<u>Column 7,</u>
Line 13, after "oven" insert --when board 12 has been removed therefrom--.

Signed and Sealed this

Fourteenth Day of August, 2001

*Attest:*

*Attesting Officer*

NICHOLAS P. GODICI
*Acting Director of the United States Patent and Trademark Office*